United States Patent [19]

Huynh et al.

[11] Patent Number: 5,726,862
[45] Date of Patent: Mar. 10, 1998

[54] ELECTRICAL COMPONENT HAVING FORMED LEADS

[75] Inventors: Due Huynh, Lawrenceville; Thomas P. Kirby, Lithonia; Micheal M. Austin, Lilburn; John E. Herrmann, Lawrenceville, all of Ga.

[73] Assignee: Motorola, Inc., Schaumburg, Ill.

[21] Appl. No.: 596,530

[22] Filed: Feb. 2, 1996

[51] Int. Cl.⁶ .................................................. H05K 7/02
[52] U.S. Cl. ........................ 361/773; 361/774; 361/807;
439/83; 439/567; 439/876
[58] Field of Search ...................................... 361/772, 773,
361/807, 809, 774; 439/55, 68, 82, 83,
567, 751, 678, 679, 876; 257/692, 696

[56] References Cited

U.S. PATENT DOCUMENTS

| | | | |
|---|---|---|---|
| 2,819,434 | 1/1958 | Mattheyses | 439/679 |
| 2,898,518 | 8/1959 | Lynn | 361/774 |
| 3,056,939 | 10/1962 | Rayburn | 361/773 |
| 4,541,034 | 9/1985 | Fanning | 361/773 |
| 4,667,270 | 5/1987 | Yagi | 361/807 |
| 4,951,124 | 8/1990 | Sawaya | 257/692 |
| 5,096,425 | 3/1992 | Takahashi | 361/773 |
| 5,109,319 | 4/1992 | Potash | 361/773 |
| 5,179,506 | 1/1993 | Corbett et al. | 361/807 |
| 5,306,949 | 4/1994 | Yamada et al. | 361/772 |
| 5,343,365 | 8/1994 | Lueneburger | 361/773 |
| 5,446,623 | 8/1995 | Kanetake | 361/773 |
| 5,469,330 | 11/1995 | Karabatsos et al. | 361/704 |
| 5,586,008 | 12/1996 | Kozel et al. | 439/83 |
| 5,616,955 | 4/1997 | Yamada et al. | 257/692 |
| 5,632,629 | 5/1997 | Legrady | 439/83 |

FOREIGN PATENT DOCUMENTS

| | | | |
|---|---|---|---|
| 0 087 126 A1 | 8/1983 | European Pat. Off. | 439/83 |
| 25 08 702 | 9/1976 | Germany | 361/773 |
| 4-62886 A | 2/1992 | Japan | 174/254 |

*Primary Examiner*—Leo P. Picard
*Assistant Examiner*—John B. Vigushin
*Attorney, Agent, or Firm*—Scott M. Garrett; Kelly A. Gardner

[57] ABSTRACT

A leaded component (10) is provided with first and second leads (14 & 16). The leads are formed with stopping deviations (26 & 28) which prevent the leads from being inserted into a circuit board (38) beyond the stopping deviations. The leads may also be provided with retaining deviations (34 & 36) which function to retain the component on the circuit board. Further, the stopping deviations may be formed so as to indicate the polarity of a component, and finally, the stopping deviations may be provided with mounting portions (50 & 52) so that the leaded component may be surface mounted on a circuit board (54).

6 Claims, 4 Drawing Sheets

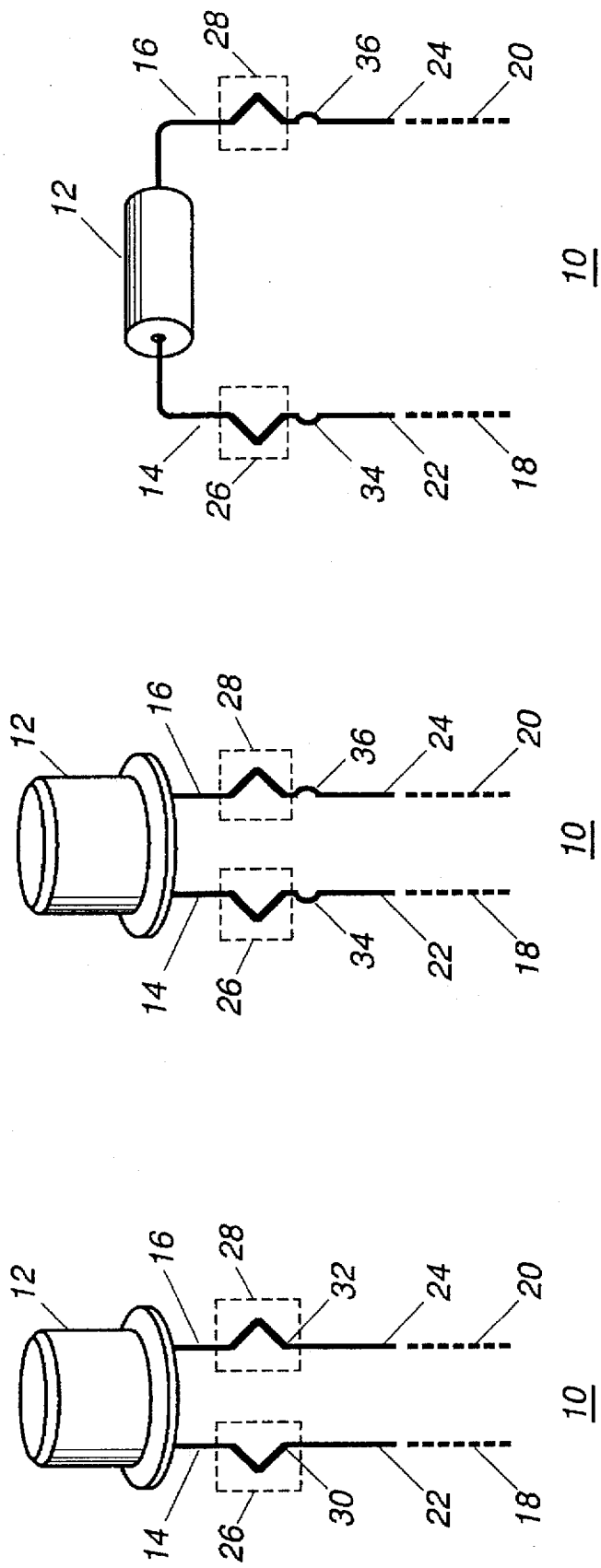

ELECTRICAL COMPONENT HAVING FORMED LEADS

TECHNICAL FIELD

This invention relates in general to electrical components, and more particularly to lead forms for electrical components.

BACKGROUND

In the assembly of electrical and electronic devices, electrical components such as resistors, capacitors, and light emitting diodes (LEDs) are typically mounted on circuit boards to form electrical circuits. Often some of these components must be elevated from the circuit board. That is, the body of the component must be raised, or otherwise spaced from the circuit board surface, while the leads of the component connect the component to the circuit board. For example, elevating a power resistor for increased air circulation is often necessary, and elevating LEDs to protrude through a corresponding opening in a device's housing to act as a visual indicator is also common practice. However, there are several problems associated with elevating components.

First, in order to space the component from the circuit board a spacer is typically used. The spacer may only be used during assembly prior to soldering the component to the board, but often the spacer is left on the board to provide mechanical support for the component. Spacers are fabricated from electrically insulating materials such as plastic, and are often formed with holes that the leads of the component fit through.

While the added material cost of a small plastic spacer is very small, the assembly cost of a circuit board is significantly affected. This is because placement of a spacer is done by hand. The intricate operations such as inserting the component leads through the spacer are best performed by human operators. This tends to limit the rate at which circuit boards may be assembled, which means that if production rates need to be increased, operators must be added. In high volume manufacturing, this added cost is very undesirable. Therefore, if the component could be elevated without the use of a spacer, a significant savings would be realized.

In addition, there is a performance issue with components elevated with spacers. Typically the spacer fits over the leads of the component, or it is only used during processing. If the component does not hold the spacer tightly to the circuit board, or if no spacer is present in the finished product, the solder joint connecting the leads of the component to the circuit board are susceptible to breaking upon impact, such as occurs if the product is dropped. This occurs when the straight leads of the component transmit the force of such an impact to the solder joints. At the very least, when this occurs that component operates intermittently, at worst it may be a safety hazard unexpected by the designer.

A second problem that results from elevating components is that they are more likely to be accidentally knocked off of the board prior to soldering. This is most likely to occur when a circuit board is transferred from a component placement line to a soldering line. None of the leaded components are soldered in place, and occasionally a component, especially an elevated component, may be inadvertently knocked off. Since the chance of this occurring is low, it will only happen infrequently in high volume manufacturing. However, since it will only happen occasionally, it is less likely to be noticed, and the product may be completely assembled before the defect is found. This will require the unit to be reworked, and will sometimes result in the unit being scrapped, causing the manufacturer to absorb the cost. A means for retaining the component would therefore provide an advantage.

A third problem that arises is with components that have a polarity, such as LEDs and electrolytic capacitors. Typically the manufacturer makes one lead of a polar component longer to indicate polarity. However, during component preparation and circuit board assembly, it is not uncommon for the leads to be trimmed to similar lengths, thereby defeating the polarity indication. Another type of polarity indication which is not lost after trimming the leads would be more preferable.

Finally, a problem arises when a leaded component is used on a board which is otherwise assembled with leadless, or surface mount components. To assemble circuit boards with leadless components a process referred to as reflow is used. The leadless components are set on the surface of the circuit board on solder pads covered with a solder paste. Then they are passed through an oven so that the solder paste melts, thereby soldering the leadless component to the solder pads. This is a very common process used throughout industry. To assemble leaded components to a circuit board a different process is used. Circuit boards for leaded components have what are commonly referred to as through holes corresponding to the component leads. The leads are inserted through the holes, and a conductor ring surrounds the hole on the bottom of the board. Once the leaded components have been place, the circuit board is passed through a wave solder machine, which, essentially, passes a wave of molten solder across the bottom of the board. The solder joins the protruding lead with the conductor ring surrounding the through hole.

Since leaded and leadless components use different processes for assembly, it is advantageous to have unified component technology. That is, all of the components are either leaded or leadless. Having both types requires two processing steps, increases assembly cost, and introduces new opportunity for process failure. Due to size constraints often placed on circuit designs, the leadless approach is preferred since leadless component technology offers much smaller components for equivalent electrical characteristics over leaded technology. However, it is often the case that some leaded components are still necessary. These "add-on" leaded components are usually hand soldered onto the circuit board after the leadless components have been processed. It would be advantageous if these leaded components could take advantage of the leadless component solder process so that hand solder operation could be eliminated.

Therefore, there exists a need for a means by which leaded components can be elevated from a circuit board without the use of spacers, and have the solder joints connecting the component leads to the board buffered from impact forces. Further, there exists a need for a means by which a leaded component can be retained on a circuit board during handling, a need for an alternative means of indicating the polarity of a leaded component, and a need for providing a leaded component with a means to be surface mounted onto a circuit board along with leadless components so that the circuit board requires one solder processing step.

BRIEF DESCRIPTION OF THE DRAWINGS

FIG. 1 is a perspective view of a leaded electrical component in accordance with a first embodiment of the invention;

FIG. 2 is a perspective view of a leaded electrical component in accordance with a second embodiment of the invention;

FIG. 3 is a perspective view of a leaded electrical component having an alternative body style in accordance with a second embodiment of the invention;

DETAILED DESCRIPTION OF THE PREFERRED EMBODIMENT

Figure 4:
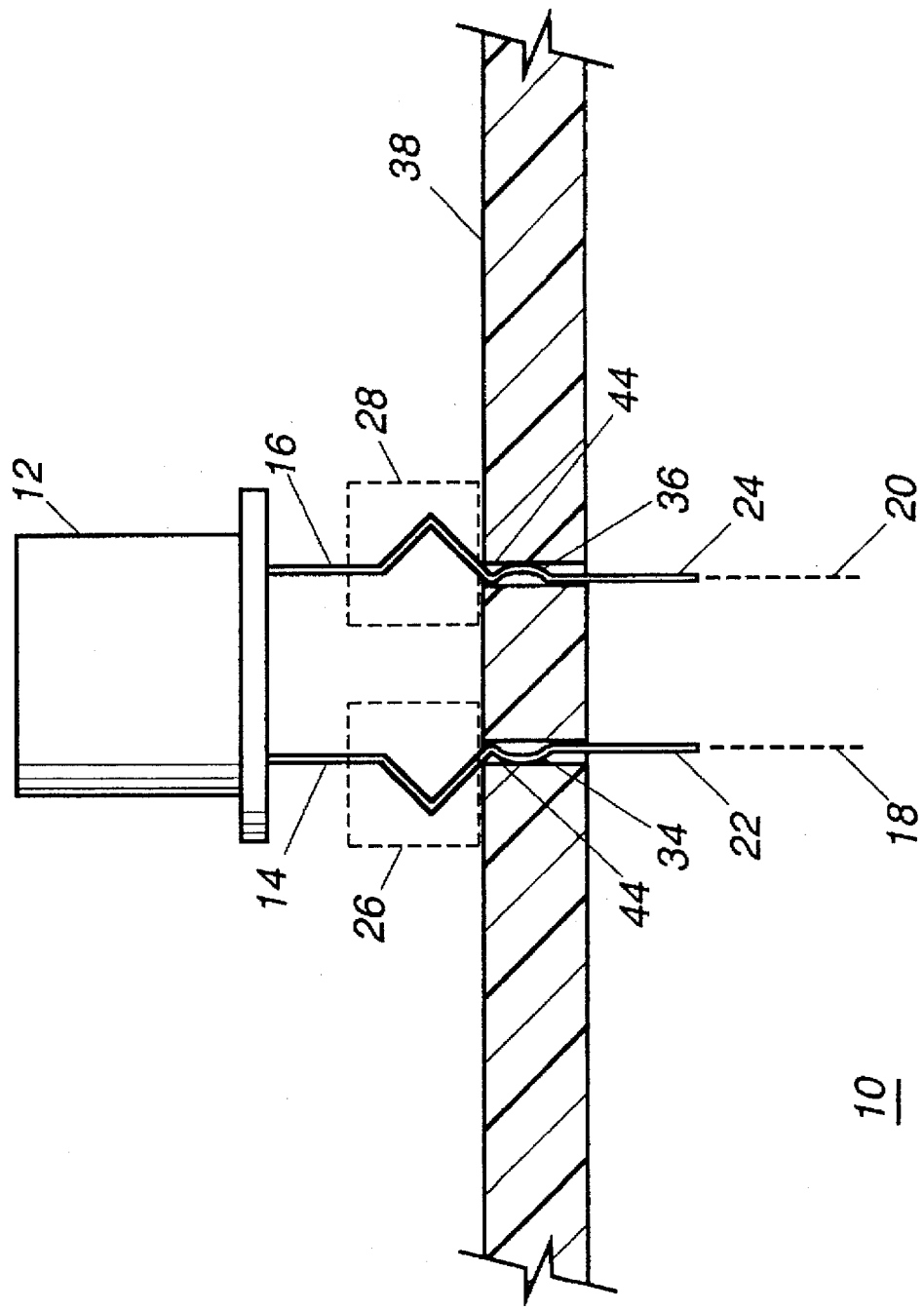
FIG. 4 is a cut-away side view of a first assembly detail of a leaded electrical component in accordance with a second embodiment of the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, where there is illustrated therein a perspective view of a leaded electrical component 10 in accordance with a first embodiment of the invention. The component 10 has a body 12 for housing the electrical component, and at least two leads, each having a portion extending from the body, such as first lead 14 and second lead 16. The body is formed of an electrically insulative material, and may be, for example, the transparent lens of an LED, or the epoxy resin body of a resistor. The leads are formed of an electrically conductive material, and are typically a metal or metal alloy. The leads have parallel portions which extend from the body of the component along substantially parallel axes, such as first axis 18 and second axis 20. Each lead has an end portion, such as first end portion 22 and second end portion 24 terminating first lead 14 and second lead 16, respectively. The circuit board, as is described in further detail hereinbelow, has a least two holes spaced corresponding with the end portions of the leads. The holes are sized so that the end portions are insertable into the holes.

To solve the first problem described above, the use of a spacer, the leads are provided with a stopping deviation, such as first stopping deviation 26 and second stopping deviation 28, formed on first lead 14 and second lead 16, respectively. The stopping deviations are so named since this section of the lead deviates from the axis of the lead, and stops insertion of the lead into the holes beyond the stopping portion. The deviations must be of sufficient degree and orientation so that when the end portions are inserted into the holes on the circuit board, the leads cannot be inserted beyond the point where the end portions meet the stopping deviation, indicated here as points 30 and 32 on the firs and second leads respectively. The stopping deviations must also have different orientations if they are formed along the same plane. Here the stopping deviations point in opposite directions along the same plane; the stopping deviation on the first lead points to the left of the figure while the topping deviation of the second lead points to the right of the figure. If they were commonly oriented in the same plane, the component could be tilted during insertion, and the leads could be inserted beyond the stopping portions.

While shown here as substantially right angled bends in the leads, it is contemplated that the actual shape of the stopping deviations may vary greatly. All that is required is that the angle of the lead deviate sufficiently from the axis of the end portion of the lead at the interface points 30 and 32, and that the stopping deviations have dissimilar orientations. For example, the leads may be bent at 90° at the interface points, then bend again at 90° to extend straight up to the component body. Once the end portions are inserted into their corresponding holes on the circuit board, the component will be spaced, or elevated from the circuit board.

An additional benefit of this lead form is that the stopping deviations buffer the solder joints connecting the leads to the circuit board from impact forces. Upon the application of such force, the bends in the component leads act as springs, thus absorbing the impact force and maintaining the integrity of the solder joints. To bear out this assertion, several battery chargers were prepared. The chargers used LEDs as visual indicators of the status of batteries inserted in the charger. The LEDs were visible through openings in the charger housing. Some LEDs utilized stopping deviations in their leads to elevate them to the correct height, others used spacers and had straight leads. The test units were then dropped from a height of approximately one meter to a concrete surface. After some 50 drops, half of the straight legged LEDs suffered broken solder joints, while none of the LEDs utilizing stopping deviations experienced any such failure.

To eliminate the nuisance of leaded components accidentally falling off of the circuit board, a second embodiment of the invention is required. FIG. 2 and FIG. 3, each a perspective view of a different leaded electrical component 10 in accordance with a second embodiment of the invention, illustrate what is required to retain the component once it has been placed. The component shown in FIG. 3 illustrates how an axial component could utilize the invention. The components shown in these figures are similar to that shown in FIG. 1, including the stopping deviations 26 and 28. However, the each lead further comprises a retaining deviation formed between the stopping deviation and the end portion of the lead, such as first retaining deviation 34 and second retaining deviation 36.

To illustrate how the retaining deviations function to retain the component, FIG. 4 illustrates a cut-away side view of a first assembly detail of a leaded electrical component 10 in accordance with a second embodiment of the invention. The component 10 is shown inserted in a circuit board 38. The circuit board is provided with a first hole 40 and a second hole 42 corresponding with first end portion 22 and second end portion 24, respectively. The retaining deviations deviate from their respective lead's axes by about the width of the corresponding holes in the circuit board. When the leads are inserted into the holes, the retaining deviations interfere with the walls 44 of the holes, thus providing a friction fit. The exact dimensions of the deviation will depend on the hole diameter, lead diameter, and amount of friction required, and it is within the skill of one having ordinary skill in the art to determine these dimensions.

Figure 5:
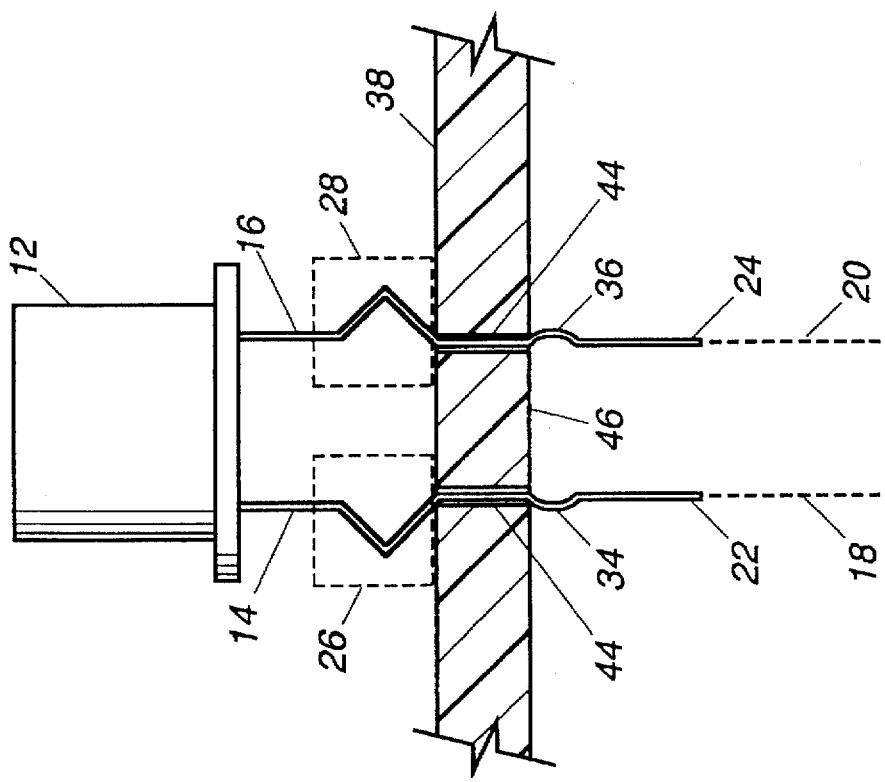
FIG. 5 is a cut-away side view of a second assembly detail of a leaded electrical component in accordance with a second embodiment of the invention.

An alternative formation of the retaining deviations is illustrated in FIG. 5. Referring now to FIG. 5, there is shown a cubaway side view of a second assembly detail of a leaded electrical component 10 in accordance with a second embodiment of the invention. The assembly and formation of the leads is similar to that shown in FIG. 4, however, here the leads are formed with a straight portion between the stopping deviation and the retaining deviation. The straight portions have a length about equivalent to the thickness of the circuit board. In this alternative embodiment, the leads act as cantilevered members. As the leads are inserted into the holes, the leads are forced together as the retaining deviations are passed through the holes. As the retaining portions emerge from the board on the bottom surface 46, the spring tendency of the leads forces them apart. Thus the component is retained by the spring force exerted by the leads, and the interference of the retaining deviations of the leads with the bottom surface of the circuit board.

Figure 6:
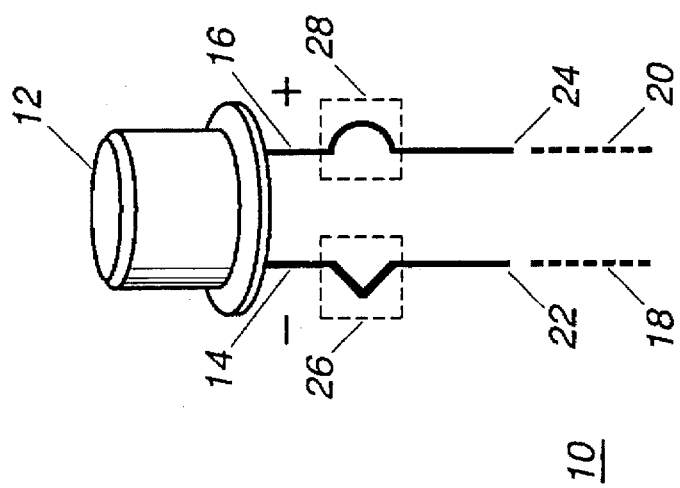
FIG. 6 is a perspective view of a leaded electrical component in accordance with a third embodiment of the invention.

As mentioned above, often the electrical component has a polarity. Examples of such components include diodes, LEDs, electrolytic capacitors, and transistors. FIG. 6, a perspective view of a leaded electrical component 10 in accordance with a third embodiment of the invention, illustrates how polarity may be indicated. Referring now to FIG. 6, the component shown is similar to that shown in FIG. 1, with one exception. Here, one of the stopping deviations is shaped differently than the other, or others if more than two leads are present. As an example, the first lead 14 has been designated as the negative terminal of the component with a minus symbol while the second lead 16 has been designated as the positive terminal with a plus symbol. Accordingly, the stopping deviation on the second lead, by virtue of it's shape, indicates this to an operator. The arrangement shown here is but one example of how the leads could be dissimilarly shaped to indicate the polarity orientation, the only requirement, beyond those already described, is that it's shape is different from the rest of the stopping deviations present. Once an operator is informed the meaning of the difference, it is a simple task to correctly orient the component for hand insertion, and it makes visual inspection of assembled boards much easier. It will be appreciated by those skilled in the art that including retaining features similar to those shown in FIGS. 2-5 would be both desirable, and simple to implement.

Figure 8:
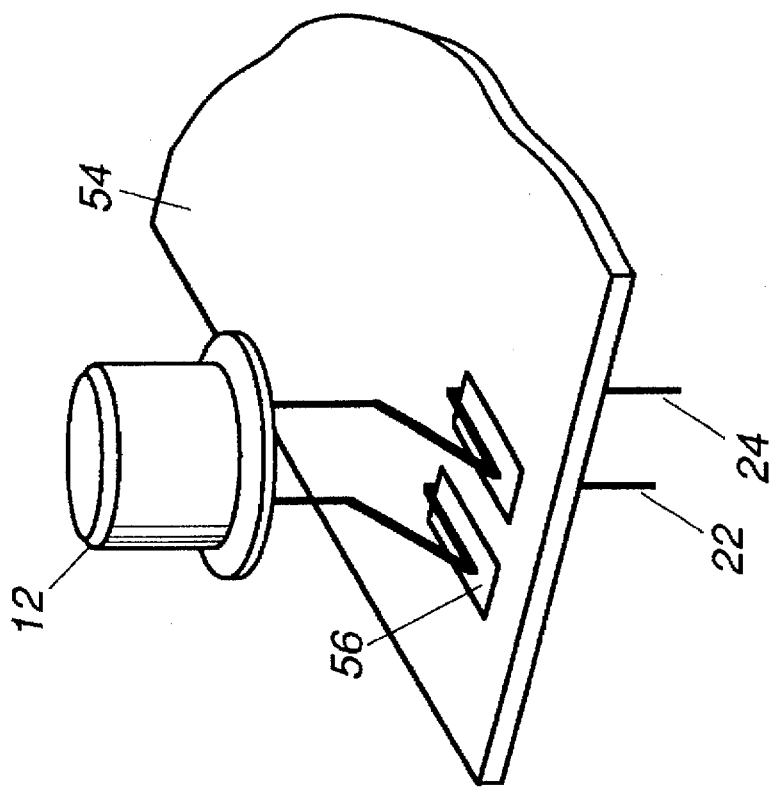
FIG. 8 is a perspective view of a leaded electrical component in accordance with a fourth embodiment of the invention illustrating an assembly detail.
Figure 7:
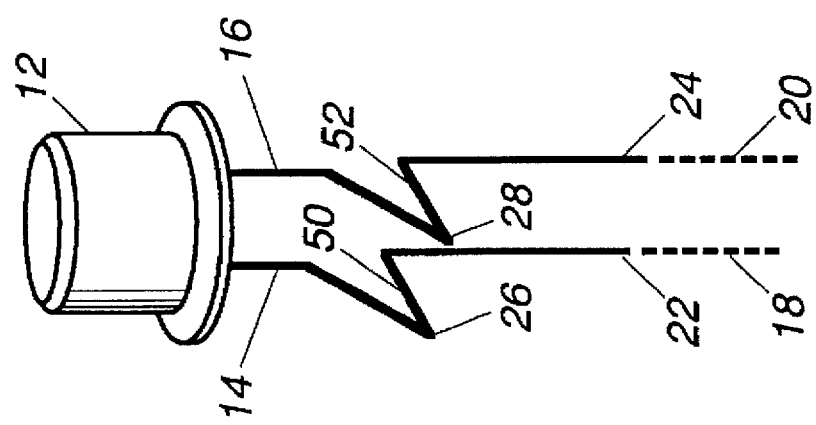
FIG. 7 is a perspective view of a leaded electrical component in accordance with a fourth embodiment of the invention.

The final problem to be broached by the invention is making a leaded component compatible with leadless component assembly processes, particularly reflow soldering. Referring now to FIG. 7, a perspective view of a leaded electrical component 10 in accordance with a fourth embodiment of the invention. The component, as in previous figures, is provided with a body 12, and at least two leads extending from the body, such as first lead 14 and second lead 16. As before, the leads are formed with stopping deviations 26 and 28. However, in order to make use of leadless component soldering technology, the stopping deviation is provided with a mounting portion, such as first mounting portion 50 and second mounting portion 52. The mounting portions are formed perpendicular to the axes of the leads so that they will rest on the circuit board. FIG. 8 illustrates how the component of FIG. 7 functions. Essentially, a circuit board 54 provides an exposed conductor pad 56 corresponding to each mounting portion. Each pad is located adjacent to a hole through the board which corresponds to the end portions 22 and 24 of the leads. Many surface mount circuit boards do not require holes on the board, but it is very inexpensive to add them, especially considering the fact that they do not need to be plated through holes, as in multi-layer boards. This structure supports the component on the surface, and eliminates the need for a further process step.

The preferred lead form for this fourth embodiment is to arrange the stopping deviations along a plane at a right angle to a plane which would intersect both leads. This provides the most support since the weight of the component is distributed over more area. If the stopping deviations were formed along the same plane, as in FIG. 1, the component would have no support along a perpendicular plane, and would fall over. The specific implementation will depend on factors such as component weight, symmetry, etc., and accordingly, it is left as a design choice for the particular circumstances.

In summary, a leaded component has been provided that can be elevated from the surface of a circuit board without the use of a spacer by means of stopping deviations formed in the leads. Further, the component can be retained on the board by the use of retaining deviations. The deviations may be also used to indicate polarity, and they may be formed such that the leaded component can take advantage of leadless component assembly technology, thereby eliminating the need for additional processes.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An electronic device, comprising:
 a substrate having conductive pads formed thereon and having at least two holes formed therethrough; and
 an electrical component for use on the substrate, said electrical component comprising:
  a body for housing said electrical component; and
  at least two leads formed of an electrically conductive material, said at least two leads having portions extending away from said body along substantially parallel axes and having end portions corresponding with, and insertable into, said at least two holes,
  wherein said at least two leads have stopping deviations formed on said leads such that said at least two leads cannot be inserted into said at least two holes beyond said stopping deviations, wherein said substrate further comprises conductor pads adjacent to said at least two holes, and wherein said stopping deviations of said at least two leads are formed each having a mounting portion perpendicular to said substantially parallel axes corresponding with one of the conductive pads such that said electrical component may be surface mounted on said substrate.

2. An electronic device as defined by claim 1, wherein said leads of said electrical component each further comprise an angled portion extending from said parallel axis to said mounting portion.

3. An electrical component as defined by claim 1, wherein said electrical component is an LED and said body is a transparent lens for said LED.

4. An electronic device, comprising:
 a printed circuit board having holes formed therethrough and conductive pads formed thereon; and
 an electrical component, comprising:
  a body; and
  leads extending from said body along substantially parallel axes, said leads having end portions for extending through said holes of said printed circuit board and stopping deviations formed on said leads between said body and said end portions, wherein said stopping deviations each have a portion perpendicular to said substantially parallel axes to allow surface mounting of said electrical component on a conductive pad of the printed circuit board.

5. The electronic device of claim 4, wherein said leads of said electrical component each further comprise an angled portion extending from said parallel axis to said portion that is perpendicular to said substantially parallel axis.

6. An electrical component as defined by claim 4, wherein said electrical component is an LED, said body is a transparent lens for said LED.

* * * * *